United States Patent [19]

Fort et al.

[11] Patent Number: 4,842,539
[45] Date of Patent: Jun. 27, 1989

[54] STRAND-TO-STRAND SHORT CIRCUIT TESTER

[75] Inventors: Emil M. Fort, Maitland; Leonard B. Simmonds, Winter Springs, both of Fla.

[73] Assignee: Westinghouse Electric Corp., Pittsburgh, Pa.

[21] Appl. No.: 226,704

[22] Filed: Aug. 1, 1988

[51] Int. Cl.$^4$ .................. H01R 13/15; H01R 4/50
[52] U.S. Cl. ............................ 439/262; 439/863
[58] Field of Search ............ 439/262, 284, 287, 292, 439/259, 261, 263, 863, 864

[56] References Cited

U.S. PATENT DOCUMENTS

| 3,016,509 | 1/1962 | Waninger | 439/292 |
| 3,601,759 | 8/1971 | Barker | 439/262 |
| 4,190,311 | 2/1980 | Basta | 439/331 |

Primary Examiner—Neil Abrams
Assistant Examiner—Khiem Nguyen
Attorney, Agent, or Firm—D. C. Abeles

[57] ABSTRACT

A plurality of connector members are provided, each of which is shaped to fit between two adjacent strands in a column of strands on a stator winding (i.e., by manual insertion). Each connector member has a first side provided with an electrically conductive material and a second side provided with an electrically insulating material. An electrically conductive lead is electrically connected to the electrically conductive material on an associated connector member. In this manner, a plurality of electrically conductive leads are connected to an associated plurality of connector members. A plug or receptacle is provided at the opposite end of the electrically conductive leads with respect to the end connected to the connector members. Securing means are provided for pressing the strands against the connector members interposed therebetween in order to insure a conductive connection between each strand and the conductive material of a connector member. The securing means can be provided in the form of a tubular member which is adapted to slide over the column of strands and interposed connector members. A wedge-shaped member can be inserted between an inside surface of the tubular member and one end of the column of strands in order to secure the tubular member to the column of strands and to press the column of strands and interposed contact members together.

10 Claims, 2 Drawing Sheets

4,842,539

STRAND-TO-STRAND SHORT CIRCUIT TESTER

BACKGROUND OF THE INVENTION

1. Field of the Invention

The present invention is directed to an improved method and apparatus for connecting a short circuit testing unit or test leads to a plurality of strands in a column of strands on a stator winding.

2. Description of the Related Art

Stator windings are generally provided with several columns of conductive strands. In certain circumstances it is necessary to connect conductive leads to the individual strands in a column of strands. For example, after manufacture, stator windings must be checked for short circuits. This necessitates the physical attachment of conductive leads from a short circuit tested to each strand.

Heretofore, methods for attaching conductive leads to each strand included securing an alligator clip to each strand. However, in order to accommodate the alligator clips, the strands had to be separated vertically and horizontally, by hand. This is an extremely time consuming and troublesome process. Moreover, the shape and size of alligator clips makes them highly likely to touch one another, and thereby short circuit, when a plurality of such clips are secured to a respective plurality of strands.

SUMMARY OF THE INVENTION

It is therefore an object of the present invention to provide a system for relatively quickly connecting electrically conducting leads to the strands on a stator winding.

It is also an object of the present invention to provide a system for connecting electrically conducting leads to the strands on a stator winding by a relatively simple process.

It is further an object of the present invention to provide a system for connecting electrically conducting leads to the strands of a stator winding in a manner which will not cause short circuits between the strands.

These and other objects are accomplished according to the present invention by employing a plurality of connector members, each of which is shaped to fit between two adjacent strands in a column of strands on a stator winding (i.e., by manual insertion). In an embodiment of the present invention, each connector member has a first side provided with an electrically conductive material and a second side provided with an electrically insulating material. An electrically conductive lead is electrically connected to the electrically conductive material on an associated connector member. In this manner, a plurality of electrically conductive leads are connected to an associated plurality of connector members. A plug or receptacle is provided at the other end of the electrically conductive leads with respect to the end connected to the connector members. Securing means are provided for pressing the strands against the connector members interposed therebetween in order to establish a conductive connection between each strand and the conductive material of a connector member. The securing means can be provided in the form of a tubular member which is adapted to slide over the column of strands and interposed connector members. A wedge-shaped member can be inserted between an inside surface of the tubular member and one end of the column of strands in order to secure the tubular member to the column of strands and to press the column of strands and interposed connector members together.

BRIEF DESCRIPTION OF THE DRAWINGS

These and other objects of the present invention will be readily appreciated upon reference to the following detailed description when considered in connection with the accompanying drawings, wherein.

DESCRIPTION OF THE PREFERRED EMBODIMENTS

Figure 1:
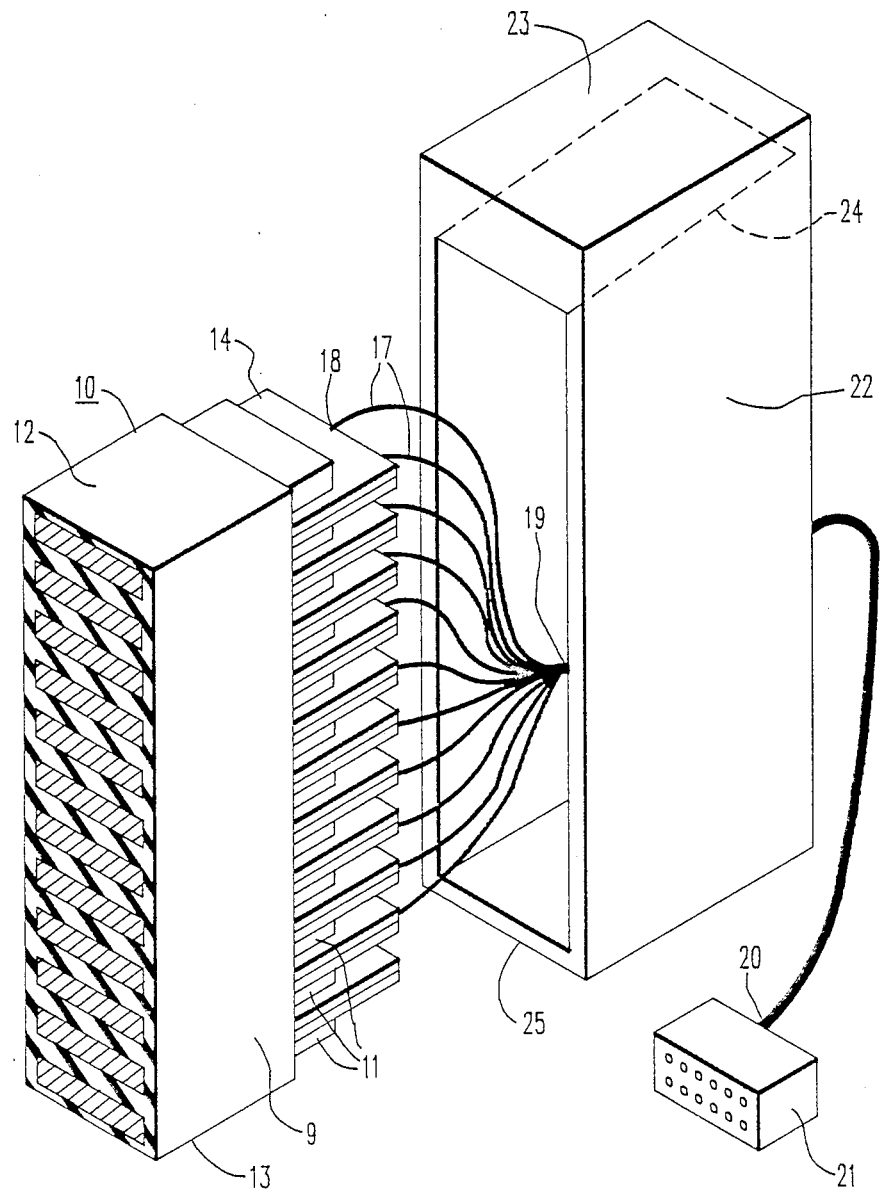
FIG. 1 is a perspective view of a column of strands with interposed connector members and a tubular securing means according to an embodiment of the present invention.

Referring to FIG. 1, a column 10 of strands 11 from a stator winding (not shown) is depicted as having a first end 12 and a second end 13. Column 10 can include several individual strands 11, each of rectangular cross section. Each strand 11 partially extends from a coating of insulating material 9. Embodiments of the present invention can be provided to accommodate any number of strands.

Also shown in FIG. 1 are several connector members 14. The connector members in the embodiment of FIG. 1 are composed of flat, rectangular members. However, other suitable shapes may be employed. The connector members 14 are further dimensioned to be sufficiently thin so as to be easily inserted (i.e., manually) between adjacent strands without requiring the strands to be spread apart.

Figure 2:
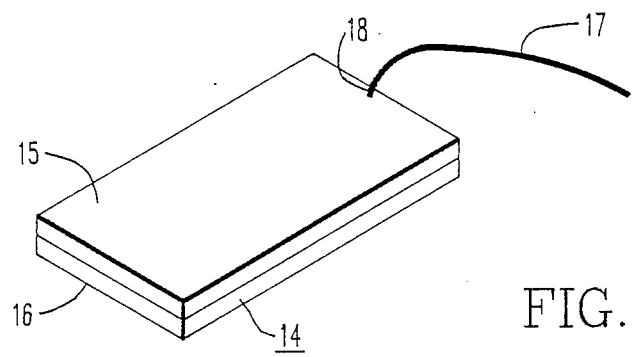
FIG. 2 is a perspective view of a connector member according to an embodiment of the present invention.

As illustrated in FIG. 2, each connector member 14 is provided with an electrically conducting layer 15 on one side and an electrically insulating layer 16 on the opposite side. Electrically conducting layer 15 can be composed of any suitable conducting material, such as copper. The electrically insulating layer 16 can be composed of any suitable insulating material, such as MICARTA. Each connector member 14 is dimensioned to fit between and abut two adjacent strands in the column 10 (i.e., by manual insertion). Furthermore, each connector member 14 is adapted to partially extend from between the strands 11 and, thus, partially extend from the column 10, upon insertion between adjacent strands in the column. In FIG. 1, several connector members are shown as being inserted between and partially extending from several of the strands 11. When a connector member 14 is fitted between two adjacent strands 11, the electrically conducting layer 15 abuts and is caused to make electrical contact with one of the two adjacent strands, while the insulating layer 16 abuts the other of the two adjacent strands.

Further shown in FIG. 1 are several electrically conductive leads 17. Electrical leads 17 are secured in electrical contact with the electrically conducting layer 15 of associated connector members 14. Each lead 17 has an end 18 which electrically contacts the conducting layer 15 of an associated connector member 14. The leads 17 in FIG. 1 are coated with an insulating material (not shown). In this regard, the leads can be placed in mutually close proximity, or abutting as shown at reference numeral 19. The leads 17 are connected to a plug or receptacle 21 at the opposite end 20 with respect to the end 18 contacting the connector members 14. The plug 21 is adapted to correspond with (i.e., plug into) a socket (not shown) in a testing unit (not shown). Other suitable means for connecting the leads 17 to a testing unit may be employed as an alternative to the plug 21.

Also shown in the embodiment of FIG. 1 is a hollow tube 22, preferably made of an insulating material such as MICARTA. The tube 22 is rectangular shaped and is provided with a first wall 23, having a tapered or sloped inside surface 24 (shown in dashed lines in FIG. 1), and a second wall 25 opposite wall 23. Tube 22 is dimensioned to loosely slide over the column 10 of strands 11, with the tapered inside surface 24 of the first wall 23 positioned adjacent the end 12 of the column 10, and the inside surface of the second wall 25 positioned adjacent the second end 13 of the column 10. As shown in FIG. 1, the leads 17 are adapted to pass through the tube 22.

Figure 4:
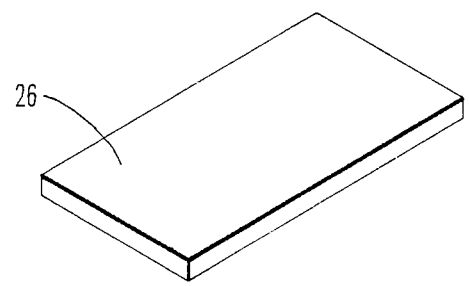
FIG. 4 is a perspective view of a spacer according to an embodiment of the present invention.

Upon sliding the tube 22 over the column 10 of strands 11, a spacer 26, as shown in FIG. 4, may be inserted between the inside surface of the second wall 25 and the second end 13 of the column 10 so as to fill extra space which may exist therebetween. Spacer 26 may be selected from a plurality of spacers having different heights, to allow tube 22 to be adapted to various strand column heights.

Figure 3:
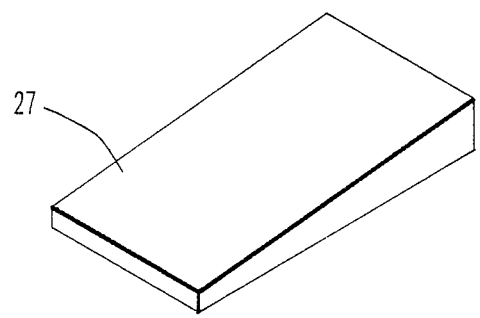
FIG. 3 is a perspective view of a wedge-shaped member according to an embodiment of the present invention.

In order to press the strands 11 and interposed connector members 14 in the column 10 together, a wedge-shaped member 27, as shown in FIG. 3, can be driven between the tapered inside surface 24 of the first wall 23 of the tube 22 and the first end 12 of the column of strands. By squeezing the strands 11 and interposed connector members 14 together, proper electrical contact between the electrically conducting layer 15 and abutting strand (the strand abutting the electrical conducting layer 15) is insured for each interposed connector member. Furthermore, squeezing the strands 11 and the interposed connector members 14 together insures that the connector members are adequately held in place between adjacent strands.

Thus the present invention offers the advantage of providing a means for quickly and easily connecting a plurality of test leads to an associated plurality of strands in a column of strands on a stator winding. The connector members are shaped, for example, as flat, rectangular members as in the embodiment of FIG. 1, so as to be easily inserted between adjacent strands without requiring manual separation of the strands. Electrical communication means are provided between each connector member and a testing unit, for example with electrical leads and a plug as in the embodiment of FIG. 1. Furthermore, means are provided for securing the connector members with the strands and for insuring electrical contact between each connector member and the strand abutting the conducting layer on each connector member, for example with a hollow tube, wedge member and spacer as in the embodiment of FIG. 1.

What is claimed is:

1. An apparatus for attaching a testing unit to a plurality of strands in a column of strands on a stator winding, said apparatus comprising:

a plurality of connector members, each of said connector members being shaped to fit between two adjacent strands in the column of strands, each of said connector members having an exposed portion adapted to extend from the column of strands upon fitting said member between adjacent strands, each of said connector members having a first side provided with an electrically conductive material and a second side provided with an electrically insulating material;

a plurality of electrically conductive leads, each of said leads being connected to said first side of a corresponding one of said plurality of connector members;

releasable coupling means having a plurality of terminals, each of said terminals being connected to a corresponding one of said plurality of electrically conductive leads, for electrically connecting said electrically conductive lead with the testing unit; and securing means for pressing the strands against said connector members fitted between the strands in order to establish a conductive connection between each strand and said conductive material of a respective connector member, said securing means comprising:

a tubular member having a first open end and a second open end, said tubular member being adapted to slide over the column of strands, said tubular member being substantially rectangular shaped and having a first wall and a second wall facing opposite said first wall, said first wall having a tapered inside surface;

a filler member adapted to fit between the inside surface of said second wall of said tubular member and a first end of the column of strands;

a wedge-shaped member adapted to wedge between said tapered inside surface of said first wall of said tubular member and a second end of the column of strands to thereby secure said tubular member to the column of strands; and wherein said plurality of electrically conductive leads are adapted to extend through said tubular member upon sliding said tubular member over the column of strands.

2. An apparatus as claimed in claim 1, wherein said filler member is selected from a plurality of filler members having different widths.

3. An apparatus as claimed in claim 1, wherein said tubular member is made of an electrically insulating material.

4. An apparatus for attaching a plurality of test leads to an associated plurality of strands in a column of strands on a stator winding, said apparatus comprising:

a plurality of connector members, each connector member being composed of a layer of conductive material and a layer of insulating material, each of said connector members being dimensioned to fit between two adjacent strands with said layer of conductive material electrically contacting one of the adjacent strands and said layer of insulating material interposed between said layer of conductive material and the other one of the adjacent strands;

securing means for pressing the strands against said connector members fitted between the strands in order to establish a conductive connection between each strand and said conductive material of a respective connector member, said securing means comprising:

a tubular member having a first open end and a second open end, said tubular member being adapted to slide over the column of strands said tubular member being substantially rectangular shaped and having a first wall and a second wall facing opposite said first wall, said first wall having a tapered inside surface;

a filler member adapted to fit between the inside surface of said second wall of said tubular member and a first end of the column of strands;

a wedge-shaped member adpated to wedge between said tapered inside surface of said first wall of said tubular member and a second end of the column of strands to thereby secure said tubular member to the column of strands;

wherein said layer of conductive material of each connector member is provided in electrical communication with an associated one of the plurality of test leads and the plurality of test leads are adapted to extend through said tubular member upon sliding said tubular member over the column of strands;

whereby upon fitting a connector member between two adjacent strands in the column of strands, electrical communication is provided between a test lead and the strand electrically contacting the conductive material.

5. An apparatus as claimed in claim 4, wherein said filler member is selected from a plurality of filler members having different widths.

6. An apparatus as claimed in claim 4, wherein said tubular member is made of an electrically insulating material.

7. An apparatus for attaching a plurality of conductive leads to an associated plurality of strands in a column of strands on a stator winding, said apparatus comprising:

a plurality of connector members, each connector member having a layer of conductive material and a layer of insulating material, each of said connector members being dimensioned to fit between two adjacent strands with said layer of conductive material electrically contacting one of the adjacent strands and said layer of insulating material interposed between said layer of conductive material and the other one of the adjacent strands, wherein each conductive lead of the plurality of conductive leads is electrically connectable with the conductive material on an associated one of said connector members;

a tubular member having a first open end, said tubular member being adapted to fit over the column of strands and connector members fitted between the strands, said tubular member being shaped to urge together the strands and said connector members fitted between the strands to insure a conductive connection between the strands and said conductive material on said connector members.

8. An apparatus as claimed in claim 7, wherein said tubular member has a second open end and wherein the plurality of conductive leads are adapted to pass through said first and second open ends of said tubular member upon said tubular member being fitted over the column of strands and connecting members fitted between the strands.

9. An apparatus as claimed in claim 7, wherein said tubular member has an inside peripheral surface and further includes a filler member for fitting between said inside peripheral surface and an end of the column of strands.

10. An apparatus as claimed in claim 9, wherein said filler member is selected from a plurality of filler members having different widths.

* * * * *